(12) United States Patent
Park

(10) Patent No.: US 8,067,293 B2
(45) Date of Patent: Nov. 29, 2011

(54) POWER SEMICONDUCTOR DEVICE AND METHOD OF MANUFACTURING THE SAME

(75) Inventor: Cho Eung Park, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 121 days.

(21) Appl. No.: 12/572,240

(22) Filed: Oct. 1, 2009

(65) Prior Publication Data
US 2010/0148254 A1    Jun. 17, 2010

(30) Foreign Application Priority Data

Dec. 12, 2008  (KR) .................. 10-2008-0126397

(51) Int. Cl.
*H01L 29/72* (2006.01)
(52) U.S. Cl. ........ 438/443; 438/294; 438/295; 438/296; 438/297; 438/404; 438/591; 438/694; 438/776
(58) Field of Classification Search .................. 438/294, 438/295, 296, 297, 404, 443, 591, 694, 778
See application file for complete search history.

(56) References Cited

U.S. PATENT DOCUMENTS
2005/0085042 A1* 4/2005 Chun et al. ............... 438/275
* cited by examiner

*Primary Examiner* — Edward Wojciechowicz
(74) *Attorney, Agent, or Firm* — The Law Offices of Andrew D. Fortney; Andrew D. Fortney; Sharon E. Brown Turner

(57) ABSTRACT

A semiconductor device and a method of manufacturing the same. The method includes preparing a semiconductor substrate having high-voltage and low-voltage device regions, forming a field insulating layer in the high-voltage device region, forming a first gate oxide layer on the semiconductor substrate, exposing the semiconductor substrate in the low-voltage device region by etching part of the first gate oxide layer and also etching part of the field insulating layer to form a stepped field insulating layer, forming a second gate oxide layer on the first gate oxide layer in the high-voltage device region and on the exposed semiconductor substrate in the low-voltage device region, and forming a gate over the stepped field insulating layer and part of the second gate oxide layer in the high-voltage device region adjoining the field insulating layer.

17 Claims, 4 Drawing Sheets

POWER SEMICONDUCTOR DEVICE AND METHOD OF MANUFACTURING THE SAME

This application claims the benefit of the Korean Patent Application No. 10-2008-0126397, filed on 12 Dec. 2008, which is incorporated herein by reference as if fully set forth herein.

BACKGROUND OF THE INVENTION

1. Field of the Invention

The present invention relates to a semiconductor device capable of improving on-resistance and a manufacturing method thereof.

2. Discussion of the Related Art

Generally, a high-voltage (HV) metal oxide semiconductor (MOS) field effect transistor (MOSFET) has high input impedance compared to a bipolar transistor, and therefore may achieve a great power gain, and a simplified gate driving circuit structure. In addition, the MOSFET, which is a unipolar device, generally does not cause time delays due to accumulation or recombination of minority carriers during turn-off of the device.

Accordingly, the MOSFET is being applied more and more widely, for example, to a switching mode power supply, a lamp ballast, and a motor driving circuit. A double diffused MOSFET (DMOSFET) structure using a planar diffusion technology is widely used as a representative of power MOSFET devices.

FIG. 1 is a cross-sectional view of a general laterally diffused MOS (LDMOS) transistor. Referring to FIG. 1, the LDMOS transistor comprises a P-type epitaxial layer 110 formed on a semiconductor substrate, an embedded insulation layer 115 disposed at an upper part of the p-type epitaxial layer 110, a high-voltage N-type well (HV NWELL) 120 disposed at an upper part of the embedded insulation layer 115, a field oxide 125 formed on a surface of the semiconductor substrate to improve pressure resistance characteristics, a P-type body 130 formed in the high-voltage N-type well 120 and disposed on one side of the field oxide 125, a low-voltage N-type well 135 formed in the high-voltage N-type well 120 and disposed on the other side of the field oxide 125, a source region 140 formed in the P-type body 130 as doped with N+ impurities, a P+ source contact region 145 disposed adjacent to the source region 140, a drain region 150 disposed in the low-voltage N-type well 135 as doped with N+ impurities, a gate insulating layer 155 formed at an upper part of the semiconductor substrate, and a gate electrode 160 formed to cover the gate dielectric layer 155 and part of the field oxide 125.

The on-resistance characteristics and breakdown voltage characteristics of the LDMOS transistor depend on the thickness of the field oxide 130. Since the field oxide 130 is generally formed using a local oxidation of silicon (LOCOS) process to have a substantially uniform thickness substantially throughout the field oxide 130, it is almost impractical to adjust thickness of the LOCOS field oxide using the general LOCOS process to thereby control the device characteristics. That is, a dedicated process is additionally required to control the device characteristics.

SUMMARY OF THE INVENTION

Accordingly, the present invention is directed to a semiconductor device and a method for manufacturing the same that substantially obviate one or more problems due to limitations and disadvantages of the related art.

An object of the present invention is to provide a semiconductor device (e.g., a power device) capable of improving on-resistance and a method for manufacturing the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) and method(s) particularly pointed out in the written description and claims hereof as well as the appended drawings.

To achieve these objects and other advantages and in accordance with the purpose of the invention, as embodied and broadly described herein, a method for manufacturing a semiconductor device may include preparing a semiconductor substrate having a high-voltage device region and a low-voltage device region, forming a field insulating layer on the semiconductor substrate in the high-voltage device region, forming a first gate oxide layer on the whole (exposed) surface of the semiconductor substrate (optionally including the field insulating layer), exposing the semiconductor substrate in the low-voltage device region by etching part of the first gate oxide layer in the low-voltage device region and also etching part of the field insulating layer so that the field insulating layer has a stepped structure, forming a second gate oxide layer on the first gate oxide layer in the high-voltage device region and on the exposed semiconductor substrate in the low-voltage device region, and forming a gate over part of the stepped field insulating layer and part of the second gate oxide layer in the high-voltage device region adjoining the field insulating layer. In variations of the manufacturing method, the field insulating layer is formed in the high-voltage device region and the low-voltage device region, and the gate poly is formed on the second gate oxide layer in the low-voltage device region.

In another aspect of the present invention, a semiconductor device may include a first conductivity-type well region in a semiconductor substrate; a field insulating layer on a surface of the first conductivity-type well region, having a stepped structure; a second conductivity-type body in the first conductivity-type well region, on one side of the field insulating layer; a gate oxide layer on the semiconductor substrate; a gate over part of the stepped field insulating layer and part of the gate oxide layer adjoining the stepped field insulating layer; a source region in the second conductivity-type body, and a drain region in the first conductivity-type well disposed on the other side of the field insulating layer. In variations, the device is a power device; the field insulating layer is in both the high-voltage region and the low-voltage region; and the gate is also on the gate oxide layer in the low-voltage device region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIG. 2a through FIG. 2d are cross-sectional views showing exemplary structures produced by exemplary process steps in manufacturing an exemplary semiconductor device according to embodiments of the present invention. Here, a semiconductor substrate 205 may be divided into a high-voltage device region A in which high-voltage devices are formed, and a low-voltage device region B in which low-voltage devices are formed.

Figure 1:
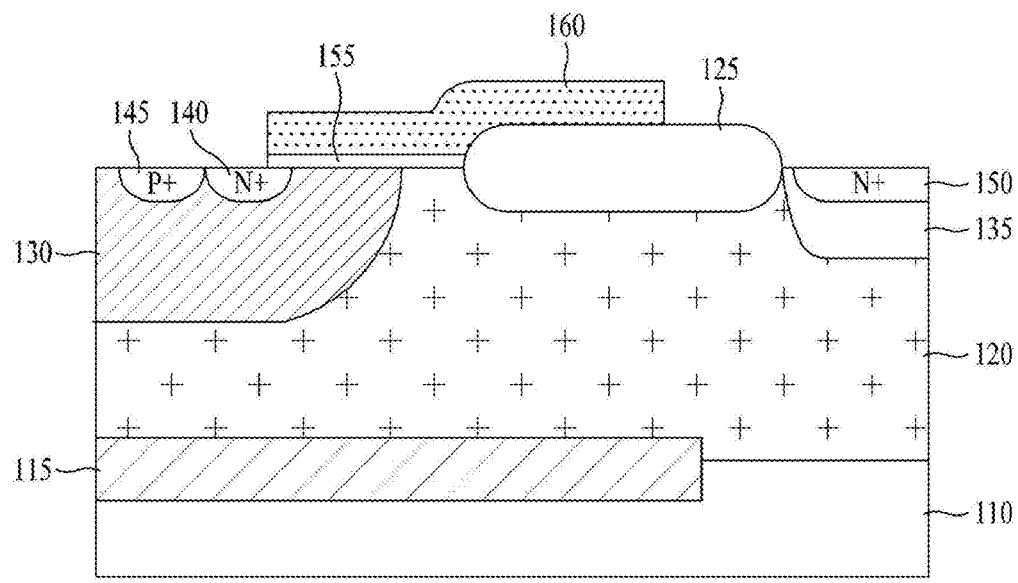
FIG. 1 is a cross-sectional view showing the structure of a laterally diffused MOS (LDMOS) transistor according to a related art.
Figure 2A:
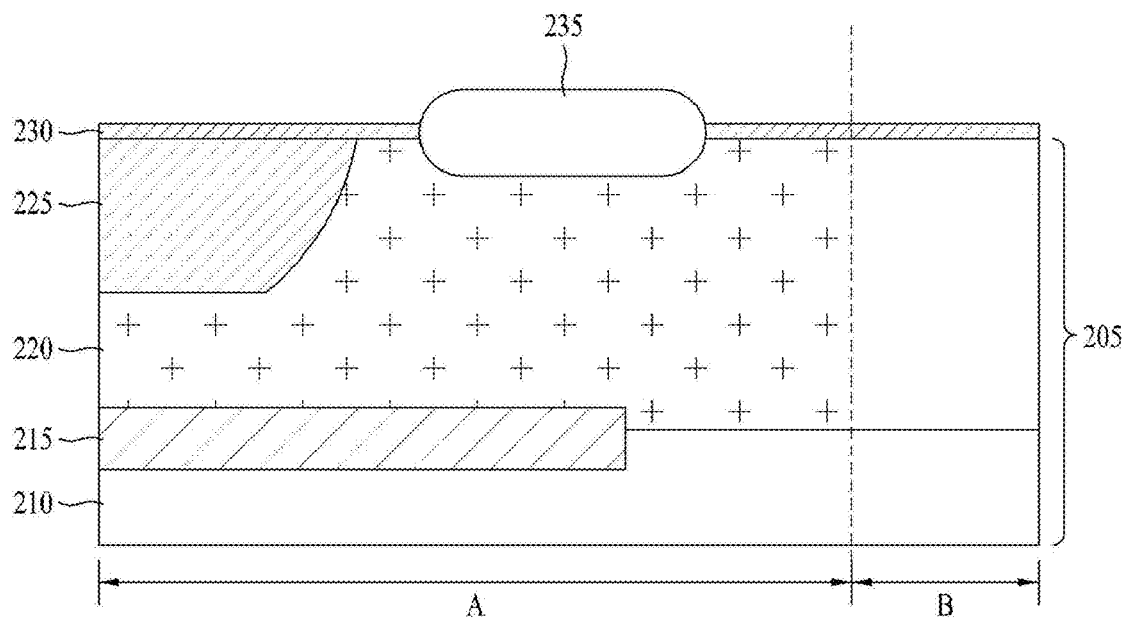
FIG. 2A through FIG. 2D are cross-sectional views showing exemplary structures formed by manufacturing an exemplary semiconductor device according to one or more embodiments of the present invention.

As shown in FIG. 2A, a P-type epitaxial layer 210 is formed on or at a lower part of a semiconductor substrate 205. Alternatively, epitaxial layer 210 may be N-type, and epitaxial layer 210 may be deposited or grown on a single crystal N-type or P-type wafer, as is known in the art. An embedded insulation layer 215 may be formed in or at an upper part of the P-type epitaxial layer 210 (e.g., at an interface between epitaxial layer 210 and a first conductivity-type well region 220) in the high-voltage device region A. The embedded insulation layer 215 may be formed by ion implantation into an epitaxial layer that includes layers 210 and 220, or by local oxidation of silicon or shallow trench isolation formed in or from epitaxial layer 210, then a second layer of silicon may be deposited or epitaxially grown on the epitaxial layer 210 and the insulation layer 215. Additionally, impurities are sequentially implanted in the high-voltage device region A using first and second masks (not shown) to form the high-voltage first conductivity-type well region 220 and a second conductivity-type body region 225 in an upper part of the high-voltage first conductivity-type well region 220 (e.g., above the embedded insulation layer 215 in the semiconductor substrate 205).

For example, N-type impurity ions such as phosphorus (P) ions are implanted in a surface of the semiconductor substrate 205 in the high-voltage device region A using a mask (not shown) that blocks implantation into the low-voltage device region B (e.g., that exposes active areas for, and an impurity diffusion and/or activation process is performed at a predetermined temperature for a predetermined time. Accordingly, the high-voltage N-type well region 220 is formed, which is also referred to as an N-drift region.

Here, the high-voltage N-type well region 220 may be extended to an upper surface of the embedded insulation layer 215 by implanting and/or diffusing the impurity ions up to the upper surface of the embedded insulation layer 215.

Next, a photolithography process is performed, thereby forming an ion implantation mask (not shown) on the semiconductor substrate. P-type impurity ions such as boron (B) ions may be implanted in a predetermined dose using the ion implantation mask, thereby forming the P-type body region 225 in the high-voltage N-type well region 220. Alternatively, if the high-voltage well region 220 has a P-type conductivity, the body region 225 may have an N-type conductivity. The P-type body region 225 may share a contact surface with the high-voltage N-type well region 220. Part of the P-type body region 225 may function as a channel region of the LDMOS transistor, as will be explained hereinafter.

Next, a field insulating layer 235 comprising a field oxide is formed on a surface of the semiconductor substrate 205, for example by a general LOCOS technology (e.g., forming a pad oxide layer and a silicon nitride layer [not shown] on the entire surface of the wafer, patterning the silicon nitride and pad oxide layers by photolithography to expose the field region of the substrate 205, optionally etching a trench with or without sloped sidewalls in the field region of the substrate 205, and thermally oxidizing the exposed field region of the substrate 205 to form the field insulating layer 235).

The field insulating layer 235 is formed on an upper surface of the high-voltage N-type well region 220, a predetermined distance from the P-type body region 225.

Next, a first gate oxide layer 230 is formed on the whole (exposed) surface of the semiconductor substrate on which the field insulating layer 235 is formed. The first gate oxide layer 230 may be on both the high-voltage device region A and the low-voltage device region B.

Figure 2B:
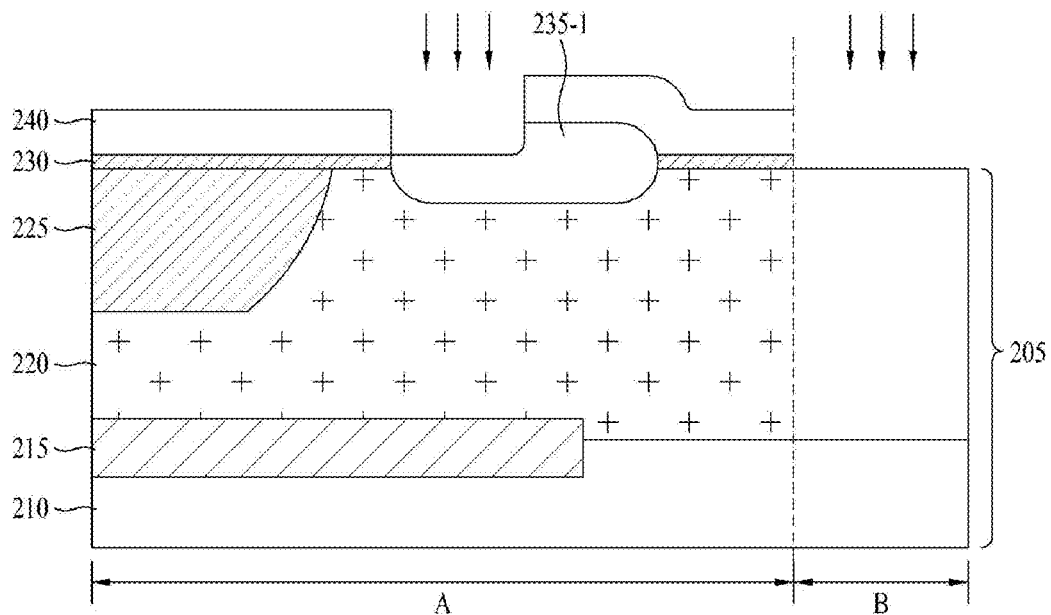

Referring to FIG. 2B, the first gate oxide layer 230 on the low-voltage device region B and part of the field insulating layer 235 are removed by etching.

More specifically, photolithography is performed on the semiconductor substrate 205 including the field insulating layer 235, thereby forming a photoresist pattern 240. The photoresist pattern 240 exposes the first gate oxide layer 230 in the low-voltage device region B and on part of the field insulating layer 235 while covering the first gate oxide layer 230 in the high-voltage device region A and on the remaining part of the field insulating layer 235. As shown in FIG. 2B, the part of the field insulating layer 235 that is removed may be a part that is relatively close to the body region 225 (or channel region of the LDMOS transistor). For example, from 20% to 80% (or any range therein, such as 40% to 60%) of the field insulating layer 235 that is farthest away from the body region 225 may be the remaining part of the field insulating layer 235 that is masked by the photoresist pattern 240.

The exposed field insulating layer 235 and the first gate oxide layer 230 in the low-voltage device region B are etched using the photoresist pattern 240 as a mask.

As the field insulating layer 235 is thus partially etched, a stepped field insulating layer 235-1 is formed. As the first gate oxide layer 230 is etched, the semiconductor substrate 205 on the low-voltage device region B is exposed.

Here, the etching degree of the field insulating layer 235 being partially etched can be adjusted by an etching time. The first gate oxide layer 230 and the part of the field insulating layer 235 are etched simultaneously. The part of the field insulating layer 235 may be further etched even after the etching the first gate oxide layer 230 is completed. Given a known rate of etching the field insulating layer 235 and the first gate oxide layer 230 (which may be the same), one may etch from about 100 Å to about 1000 Å (or any range therein) of the field insulating layer 235. Such etching may comprise wet etching (e.g., with dilute aqueous HF or buffered aqueous HF) or dry etching (e.g., by plasma etching using a fluorocarbon and/or hydrofluorocarbon etchant, optionally in the presence of an oxygen or hydrogen source such as $O_2$ or $H_2$).

Figure 2C:
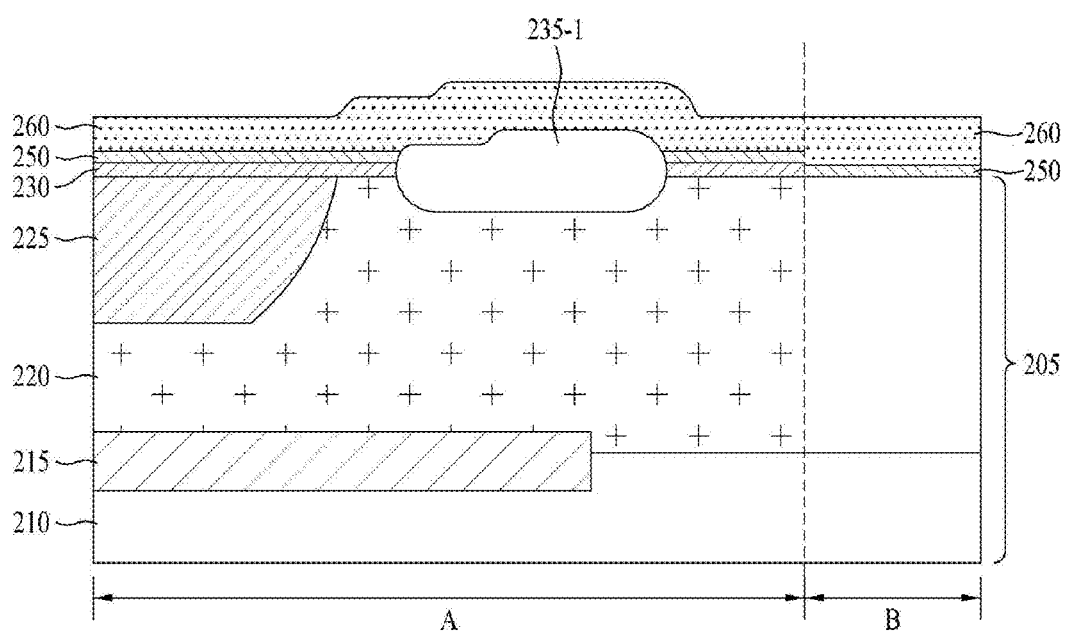

Referring to FIG. 2c, next, the photoresist pattern is removed by ashing or stripping (e.g., by plasma ashing in the presence of an oxygen source such as $O_2$).

A second gate oxide layer 250 is formed on (or in addition to) the first gate oxide layer 230 in the high-voltage device region A and on the exposed semiconductor substrate 205 in the low-voltage device region B. Generally, the second gate oxide layer 250 is formed by wet or dry thermal oxidation.

Accordingly, the gate oxide layer is thicker in the high-voltage device region A than in the low-voltage device region B. This is sometimes referred to as a "dual gate" oxidation process.

Next, a polysilicon layer 260 is vapor-deposited (e.g., by chemical vapor deposition, or CVD) on the second gate oxide layer 250.

Figure 2D:
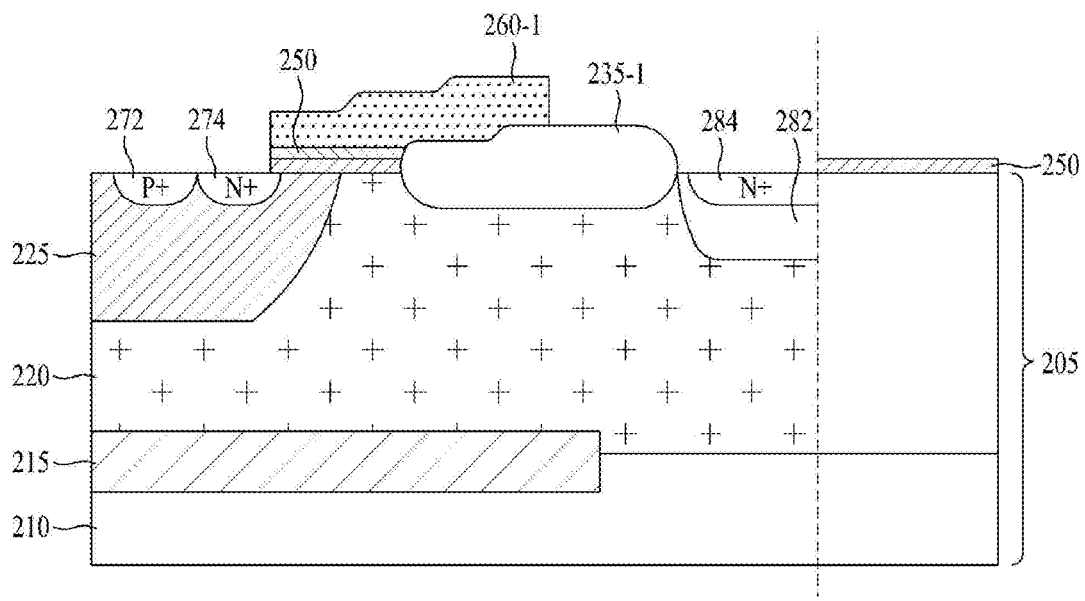

After that, as shown in FIG. 2D, the polysilicon layer 260 is patterned (e.g., by photolithography and etching) to thereby form a gate poly 260-1 partially covering the field insulating layer 235-1 having the stepped structure and part of the second gate oxide layer 250 adjoining the field insulating layer 235-1. Generally, the gate poly 260-1 covers a part of the body region 225 closest to the field insulating layer 235-1 as well as an intervening region of the high-voltage well region 220. The polysilicon layer 260 may further comprise a metal silicide layer thereon, generally prior to patterning to form the gate 260-1. In addition, one or more gates (not shown) may be simultaneously formed in the low voltage region B by patterning the polysilicon layer 260.

For example, the gate poly 260-1 may have a stepped structure with the same profile as the stepped field insulating layer 235-1.

In addition, exposed regions of the second gate oxide layer 250 and the first gate oxide layer 230 in the high-voltage device region A are selectively etched, thereby exposing part of the P-type body region 225 and part of the high-voltage N-type well region 220. Such selective etching may be performed in the same manner as described above for etching the first gate oxide layer 230.

Using corresponding masks (not shown), impurities are implanted in parts of the exposed P-type body region 225, thereby forming a source region 274 doped with impurities of the first conductivity type (for example, N+ type) and a source contact region 272 of a second conductivity type (for example, P+ type) adjacent to the source region 274. The masks for forming the source region 274 and the source contact region 272 are formed separately, using separate patterned photoresists (e.g., patterned by photolithography and development).

Impurities are also implanted in an exposed surface of the high-voltage N-type well region 220, thereby forming a first conductivity-type low-voltage well 282 and a first conductivity-type drain region 284. The first conductivity-type low-voltage well 282 is formed using a mask separate from the masks for forming the source region 274 and the source contact region 272, but the first conductivity-type drain region 284 may be formed using the same mask as the source region 274.

Figure 3A:
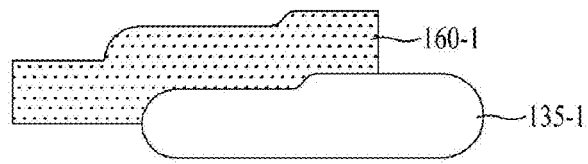
FIG. 3A through FIG. 3C are views showing a field insulating layer and a gate electrode having a stepped structure according to various embodiments of the present invention.
Figure 3B:
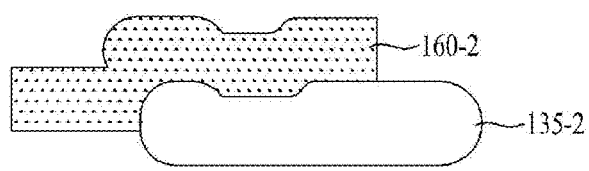
Figure 3C:
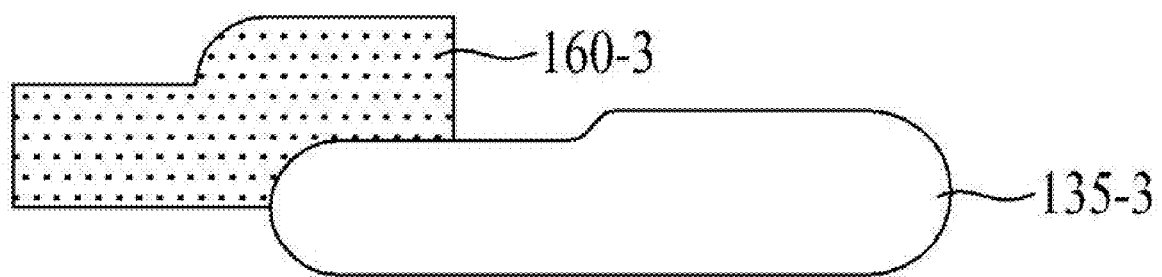

FIG. 3A to FIG. 3C show various embodiments of the stepped field insulating layer and the gate poly according to the present invention.

More specifically, FIG. 3A to FIG. 3C show respectively different configurations of the field insulating layer and the gate poly. The on-resistance (Ron) of the device is influenced by thickness of the gate insulating layer 135-1, 135-2 or 135-3 at the lower part of the gate poly 160-1, 160-2 or 160-3.

Since the strength of the electric field generated in the drift region at the lower part of the field insulating layer may vary according to the configuration and/or cross-sectional profile of the field insulating layer and the gate poly, the on-resistance may also vary according to the configuration of the field insulating layer and the gate poly.

In a first example, the field insulating layer 135-1 is partially thinned as shown in FIG. 3A. In the field insulating layer 135-1, substantially the entire portion closest to the body region 225 (e.g., the closest 30-50% of the field insulating layer 135-1) is thinned. The electric field concentrates in the drift region below the thinned part of the field insulating layer 135-1, thereby causing an increase in the flow of electrons from the source region to the drain region relative to an otherwise identical field insulating layer that has not been thinned. As a result, the on-resistance of the device is decreased.

In a second example, the field insulating layer 135-2 is partially thinned in an internal region as shown in FIG. 3B. In the field insulating layer 135-2, the region closest to the body region 225 (e.g., the closest 5-10% of the field insulating layer 135-2, or a "margin" region) may be masked to ensure that the entire first gate oxide 230 in the high-voltage device region A is protected (i.e., not etched during the process of thinning the field insulating layer 235), taking the photolithographic margin for the thinning process into account. The internal region may be the 20-60% (or any range therein, such as 25-40%) of the field insulating layer 135-2 closest to the body region 225 other than the margin region. The electric field still concentrates in the drift region below the thinned part of the field insulating layer 135-2, thereby causing an increase in the flow of electrons from the source region to the drain region relative to an otherwise identical field insulating layer that has not been thinned. As a result, the on-resistance of the device including field insulating layer 135-2 is also decreased.

In a third example shown in FIG. 3C, the field insulating layer 135-3 is partially thinned in substantially the same manner as the field insulating layer 135-1. However, the gate 160-3 does not overlap the stepped part of the field insulating layer 135-3. The electric field still concentrates in the drift region below the thinned part of the field insulating layer 135-3 and the gate 160-3, thereby causing an increase in the flow of electrons from the source region to the drain region relative to an otherwise identical field insulating layer that has not been thinned. As a result, the on-resistance of the device including field insulating layer 135-2 is also decreased.

The breakdown voltage of high-voltage devices such as LDMOS transistors is influenced by the thickness of the field insulating layer below an end part of the gate poly (e.g., above the gate oxide, as opposed to above the field oxide). However, the field insulating layers 135-1 and 135-2 below parts of the gates 160-1 and 160-2 in FIGS. 3A and 3B have relatively uniform thicknesses, and therefore have almost no influence on the breakdown voltage.

As described above, according to embodiments of the present invention, a method of manufacturing a semiconductor device varies the LOCOS profile using (or during) a dual gate oxidation process and improves the electric field characteristics with respect to the drift region by combining a stepped LOCOS profile with the gate poly. Consequently, the on-resistance of the semiconductor device may be improved.

It will be apparent to those skilled in the art that modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a semiconductor device, comprising:
    preparing a semiconductor substrate having a high-voltage device region and a low-voltage device region;

forming a field insulating layer in the high-voltage device region;

forming a first gate oxide layer on exposed surfaces of the semiconductor substrate;

etching part of the field insulating layer to form a stepped field insulating layer and etching part of the first gate oxide layer to expose the semiconductor substrate in the low-voltage device region;

forming a second gate oxide layer on the first gate oxide layer in the high-voltage device region and on the exposed semiconductor substrate in the low-voltage device region; and forming a gate poly over part of the stepped field insulating layer and part of the second gate oxide layer in the high-voltage device region adjoining the field insulating layer.

2. The method according to claim 1, wherein the gate poly has a stepped structure with a same profile as the stepped field insulating layer.

3. The method according to claim 1, further comprising:

forming a second conductivity-type epitaxial layer as part of the semiconductor substrate;

forming an embedded insulation layer in the second conductivity-type epitaxial layer in the high-voltage device region;

forming a high-voltage first conductivity-type well region and a second conductivity-type body region in the semiconductor substrate above the embedded insulation layer, by implanting impurities in the high-voltage device region;

forming a source region doped with first conductivity-type impurities and a second conductivity-type source contact region adjoining the source region, by implanting impurities in part of the second conductivity-type body region; and forming a first conductivity-type low-voltage well and a first conductivity-type drain region, by implanting impurities in the high-voltage first conductivity-type well region.

4. The method according to claim 1, wherein etching part of the field insulating layer and etching part of the first gate oxide layer are performed simultaneously.

5. The method according to claim 4, further comprising continuing to etch the part of the field insulating layer after the part of the first gate oxide layer is completely etched.

6. A method of manufacturing a semiconductor device, comprising:

forming a field insulating layer in a high-voltage device region of a semiconductor substrate;

forming a first gate oxide layer on exposed surfaces of the semiconductor substrate;

simultaneously etching part of the field insulating layer and the first gate oxide layer in the low-voltage device region to expose the semiconductor substrate in the low-voltage device region and form a stepped field insulating layer;

forming a second gate oxide layer with the first gate oxide layer in the high-voltage device region and on the exposed semiconductor substrate in the low-voltage device region; and forming a gate over part of the stepped field insulating layer and part of the second gate oxide layer in the high-voltage device region adjoining the field insulating layer.

7. The method according to claim 6, wherein the semiconductor substrate comprises a second conductivity-type epitaxial layer.

8. The method according to claim 7, further comprising forming an embedded insulation layer in the epitaxial layer in the high-voltage device region.

9. The method according to claim 8, further comprising implanting first conductivity-type impurities above the embedded insulation layer to form a high-voltage well region.

10. The method according to claim 8, further comprising implanting second conductivity-type impurities above the embedded insulation layer to form a body region.

11. The method according to claim 10, further comprising implanting first conductivity-type impurities in the body region to form a source region.

12. The method according to claim 11, further comprising implanting second conductivity-type impurities in the body region adjoining the source region to form a source contact region.

13. The method according to claim 10, further comprising implanting first conductivity-type impurities in a part of the high-voltage well region opposite to the field insulating layer to form a low-voltage well.

14. The method according to claim 11, further comprising implanting first conductivity-type impurities in a part of the high-voltage well region opposite to the field insulating layer to form a drain region.

15. The method according to claim 14, wherein the source region and the drain region are formed simultaneously.

16. The method according to claim 6, further comprising forming one or more additional gates over the second gate oxide layer in the low-voltage device region.

17. The method according to claim 6, further comprising continuing to etch the part of the field insulating layer after the part of the first gate oxide layer is completely etched.

* * * * *